United States Patent [19]

Kato et al.

[11] Patent Number: 5,198,377
[45] Date of Patent: Mar. 30, 1993

[54] METHOD OF MANUFACTURING AN ACTIVE MATRIX CELL

[76] Inventors: Kinya Kato, 383-25, Oaza Kamifujisawa, Iruma-shi, Saitama; Nobuhiko Kakuda, 19-5, Sekimachiminami 3-chome, Nerima-ku, Tokyo; Noboru Naito, 6-8, Sennincho 3-chome, Hachioji-shi, Tokyo; Tsutomu Wada, 6-9, Tenjincho 4-chome, Huchu-shi, Tokyo, all of Japan

[21] Appl. No.: 728,851

[22] Filed: Jul. 9, 1991

Related U.S. Application Data

[60] Continuation of Ser. No. 321,501, Mar. 9, 1989, abandoned, which is a division of Ser. No. 222,844, Jul. 22, 1988, Pat. No. 4,918,504.

[30] Foreign Application Priority Data

| Jul. 31, 1987 | [JP] | Japan | 62-192341 |
| Dec. 22, 1987 | [JP] | Japan | 62-322983 |
| Dec. 28, 1987 | [JP] | Japan | 62-329956 |

[51] Int. Cl.⁵ .................. H01L 21/336; H01L 21/312
[52] U.S. Cl. ...................................... 437/40; 437/101; 437/229
[58] Field of Search .............. 437/40, 41, 101, 228, 437/229; 357/23.7, 2, 4, 45; 427/43.1, 42, 96, 54.1; 156/659.1, 660, 661.1, 663

[56] References Cited

U.S. PATENT DOCUMENTS

| 4,022,927 | 5/1977 | Pfeiffer et al. | 427/43.1 |
| 4,086,694 | 5/1978 | U | 437/228 |
| 4,578,859 | 4/1986 | Hause et al. | 437/56 |
| 4,665,419 | 5/1987 | Suzuki | 357/23.7 |
| 4,700,458 | 10/1987 | Suzuki et al. | 437/41 |
| 4,704,194 | 11/1987 | Szydlo et al. | 437/41 |
| 4,718,773 | 10/1988 | Sukegawa | 437/41 |
| 4,759,610 | 1/1988 | Yanagisawa | 357/23.7 |
| 4,788,157 | 11/1988 | Nakamura | 437/46 |
| 4,918,032 | 4/1990 | Jain et al. | 437/228 |

FOREIGN PATENT DOCUMENTS 0192368 9/1985 Japan .................. 437/101

*Primary Examiner*—Mary Wilczewski

[57] ABSTRACT

An active matrix cell includes a first conductor group formed on a transparent substrate, two-layered regions consisting of a semiconductor film and a first insulating film, a second insulating film and a second conductor group. The first conductor group forms the source and drain of a thin film transistor, pixel electrode, data line. One of the two-layered regions serves as an active region of the thin film transistor and the other of the two-layered regions serves as the intersection between the data and scanning lines. The second insulating film is buried in the gap between the two-layered regions and the first conductor group, and has substantially a same thickness as the two-layered regions. The second conductor group forms the scanning line and the part of the data line. A method of manufacturing the active matrix cell is also disclosed.

5 Claims, 10 Drawing Sheets

150

METHOD OF MANUFACTURING AN ACTIVE MATRIX CELL

This is a continuation of application Ser. No. 07/321,501 filed Mar. 9, 1989, abandoned, which is a divisional of application Ser. No. 222,844 filed Jul. 22, 1988, now U.S. Pat. No. 4,918,504.

BACKGROUND OF THE INVENTION

The present invention relates to an active matrix cell driven by a thin-film field effect transistor (to be referred to as a TFT hereinafter) used in a liquid crystal display, and a method of manufacturing the active matrix cell.

A liquid crystal display (LCD) using a liquid crystal as a display medium has been studied and developed in place of a CRT display since the LCD has a small depth and low power consumption and is compact as compared with the CRT display, and some liquid crystal display models are popular in practical applications. In recent years, an active matrix type liquid crystal display has received a great deal of attention. In this active matrix type liquid crystal display, TFTs are arranged in each pixel to drive the pixel.

A typical active matrix type liquid crystal display has a structure wherein a liquid crystal is sandwiched between an active matrix substrate having TFTs thereon and a counter substrate, an entire surface of which receives a uniform potential. Basic units (pixels) consisting of TFTs and pixel electrodes are arranged on the active matrix substrate in a matrix form. Scanning lines for controlling the TFTs and data lines for supplying data to the pixel electrodes are arranged in a matrix form along the X and Y directions. On a discussion of an active matrix substrate, only a repetition unit including parts of data and scanning lines 1 and 2, a TFT 3, and a pixel electrode 4, as shown in FIG. 7, can be taken into consideration to grasp the entire structure of the active matrix substrate. The repetition unit is defined as an active matrix cell herein. Referring to FIG. 7, reference numeral 5 denotes a source of the TFT 3; 6, a drain of the TFT 3; 7, an intersection region between the data and scanning lines 1 and 2. It should be noted that the drain and source of a general TFT are not discriminated from each other.

Since an active matrix substrate having TFTs formed thereon is used in an active matrix type liquid crystal display, the fabrication process is more complex than a simple multiplex type liquid crystal display in which a liquid crystal is sandwiched between an X-direction wiring substrate and a Y-direction wiring substrate. Therefore, the product yield of the active matrix type displays is undesirably decreased, and it is difficult to provide a high-quality large display at low cost. Various attempts have been made to decrease the number of steps in manufacturing the active matrix substrate. The process is often evaluated by the number of photomasks (to be referred to as masks hereinafter). Active matrix substrate manufacturing processes from which manufacturing steps are reduced are called two- and three-mask processes, which are reported as transactions and the like. The number of masks under discussion is the number required for manufacturing the active matrix substrate. Therefore, masks required for forming an alignment layer are excluded from the number of masks.

A conventional active matrix substrate manufacturing method from which the manufacturing steps are reduced will be described below. The scanning and data lines are indispensable elements in the active matrix substrate. Therefore, two masks for the scanning and data lines cannot be eliminated.

The two-mask process is described in "AN IMPROVED DESIGN OF ACTIVE MATRIX LCD REQUIRING ONLY TWO PHOTOLITHOGRAPHIC STEPS", Y. Lebosq, et al., 1985 INTERNATIONAL DISPLAY RESEARCH CONFERENCE, pp. 34-36. This reference describes a process for forming scanning lines, data lines, TFTs, and pixel electrodes by using only two masks. Structural diagrams of an active matrix cell manufactured by the above process are illustrated in FIGS. 8A and 8B. Referring to FIG. 8A, the active matrix cell can be manufactured by only a first mask (non-hatched region) for forming data lines 10 and a pixel electrode 11 and a second mask (region of hatches inclined upward to the right) for forming a scanning line 12. FIG. 8B is a sectional view of the active matrix cell in FIG. 8A along the line VIIIB-VIIIB' thereof. Reference numerals 13a and 13b denote indium-tin-oxide (to be referred to as ITO hereinafter) conductive films; 14a and 14b, n-type amorphous silicon (to be referred to as n+a-Si hereinafter); 15, amorphous silicon (to be referred to as a-Si hereinafter); 16, silicon oxide ($SiO_2$) serving as a gate insulating film; and 17, an aluminum (to be referred to as Al hereinafter) wiring.

According to the above method, since only two masks are used, a parasitic TFT region 19 as an unnecessary TFT region in addition to a TFT region 18 serving as a necessary active element is undesirably formed under the scanning line 12, resulting in a decisive drawback. That is, when a channel length of the parasitic TFT region 19 is large, a conductivity is small and the display characteristics are not so adversely affected. However, when the channel length is decreased, the display characteristics are greatly degraded.

The three-mask process is a process wherein a TFT formation mask is added to the data line mask. For this reason, each TFT is limited to the necessary region and a parasitic TFT region can be eliminated, thus manufacturing an ideal structure.

FIGS. 9A to 9E are sectional views showing steps in manufacturing an active matrix cell according to the three-mask process, as described in "A 640×400 Pixel Active-Matrix LCD Using a-Si TFT's", T. Sunata, et al., IEEE TRANSACTIONS ON ELECTRON DEVICES, Vol. ED-33, No. 8, 1986, pp. 1218-1221. In this process, after a protective layer 21 is formed on a glass substrate 20, a transparent conductive film to be used for source and drain of the TFT, the data line, and the pixel electrode is deposited. In this case, an ITO film is used and patterned to form a transparent conductive film 22 (first mask), as shown in FIG. 9A. A phosphorus-doped n+a-Si film 23 is selectively formed on the transparent conductive film 22 to form the source and and drain of the TFT, as shown in FIG. 9B. An a-Si film is deposited and patterned to form a TFT semiconductor region 24 (second mask). The a-Si film and the n+a-Si film excluding the TFT region 24 are simultaneously removed, as shown in FIG. 9C. As shown in FIG. 9D, a silicon nitride (to be referred to as $SiN_x$ hereinafter) film 25 serving as a gate insulating film is deposited. Finally, a metal film, e.g., an Al film is deposited and patterned to obtain a scanning line 26 so as to include the gate electrode (third mask), as shown in FIG. 9E. The active matrix cell is formed using first to third masks in this process. Since the TFT thus formed has a gate electrode as the uppermost layer, this TFT is called a top gate staggered TFT. The drain and source of the TFT consist of lead lines for externally extracting currents and regions for effectively injecting only necessary carrier into the semiconductor. Although source and drain regions having a high impurity concentration (i.e., $n^+$ or $p^+$ region) formed by diffusion or the like is used in a transistor using crystalline silicon, an $n^+$a-Si film is used for source and drain to be deposited separately and additionally in a TFT using a-Si.

In the three-mask process, however, a photolithographic step and an a-Si film etching step are required between formation of the a-Si film serving as a TFT active region and formation of the $SiN_x$ film serving as the gate insulating film. An important interface for determining characteristics of a metal-insulator-semiconductor (MIS) field effect TFT tends to be contaminated. It is therefore difficult to form a high-mobility TFT with high reproducibility. In addition, the transparent conductive film 22 as the lowermost layer serves as the data line. When a display area is to be increased, the resistance of the transparent conductive film 22 must be reduced. However, the thickness of the transparent conductive film 22 cannot be extremely increased due to the following reason.

A film formed by normal plasma chemical vapor deposition (to be referred to as a PCVD hereinafter) used as a deposition method of the a-Si film has poor step coverage at the pattern edge and causes degradation of the TFT characteristics. In particular, when a step height increases, these affections become severe. In order to decrease a data line resistance in the above process, through holes must be formed in the $SiN_x$ film 25 existing on the entire surface and another metal wiring pattern must be formed to decrease the data line resistance. However, this process requires at least an additional mask for forming the through holes, thus losing the advantage of the three-mask process. Terminals must be extracted from the peripheral portion of the substrate to apply voltages to the data lines formed of the transparent conductive film 22 as the lowermost layer in the above process. For this reason, an insulating film should not exit on the peripheral transparent conductive film 22 portion. In order to manufacture an active matrix using the above mentioned active matrix cell, a metal mask must be prepared not to deposit the $SiN_x$ 25 on the peripheral transparent conductive film 22 portion during deposition of the $SiN_x$ 25 serving as a gate insulating film. The metal mask is aligned with the pattern on the substrate with a microscope. Poor mask alignment and poor contact between the metal mask and the substrate cause undesirable deposition of the insulating film under the metal mask.

SUMMARY OF THE INVENTION

It is, therefore, a principal object of the present invention to provide an active matrix cell and a method of manufacturing the same with good reproducibility at a high yield and, more particularly, to provide an active matrix cell and a method of manufacturing the same, wherein a wiring pattern is formed on a substantially smooth surface, and possibilities of a disconnection and a short circuit by poor step coverage can be greatly reduced.

It is another object of the present invention to provide an active matrix cell having a minimum line resistance and a method of manufacturing the same.

It is still another object of the present invention to provide an active matrix cell and a method of manufacturing the same, wherein a display area can be easily increased.

It is still another object of the present invention to provide an active matrix cell and a method of manufacturing the same according to a three-mask process having a smaller number of manufacturing steps.

In order to achieve the above objects of the present invention, there is provided an active matrix cell comprising a first conductor group formed on a transparent substrate and constituting a source and a drain of a field effect thin-film transistor, part of a data line, and a pixel electrode, two-layered regions formed on the transparent substrate and consisting of a semiconductor film and a first insulating film which is formed on the semiconductor film and an area of the first insulating film in the two-layered regions has substantially the same area as that of the semiconductor film, a second insulating film contacting a side surface of the two-layered regions, having substantially the same thickness as that of the two-layered regions, and covering a region excluding the two-layered regions and the first conductor group, and a second conductor group serving as a scanning line and part of the data line, wherein one of the two-layered regions connects the source and the drain, partially overlaps the source and the drain so as to serve as an active region of the thin-film transistor, and the other of the two-layered regions overlaps the data line so as to have an area larger than an area defined by widths of adjacent ones of the data and scanning lines at an intersection region between the data and scanning lines, and one second conductor of the second conductor group serving as the scanning line partially overlaps the source and the drain therebetween on the two-layered region serving as the active region of the thin-film transistor so as to have a width larger than a distance between the source and the drain, and the other second conductors of the second conductor group serving as the parts of the data line are insulated from the scanning line.

DESCRIPTION OF THE PREFERRED EMBODIMENTS

Figure 1:
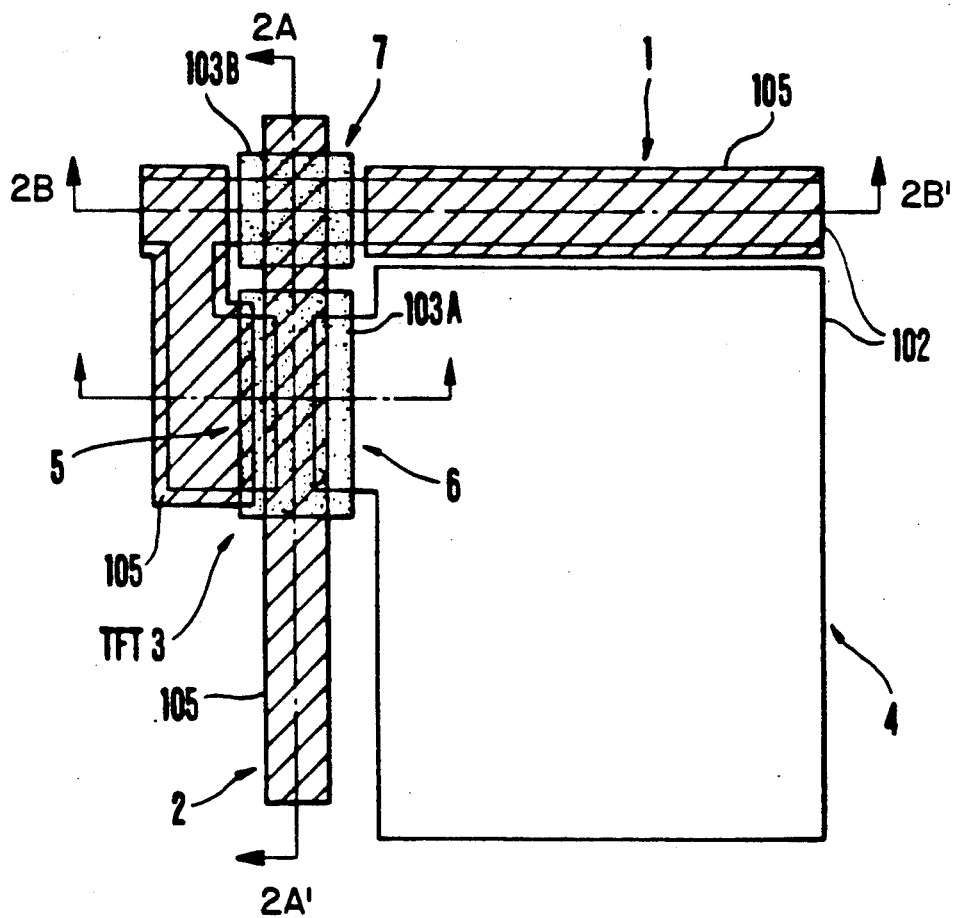
FIG. 1 is a plan view showing an active matrix cell according to an embodiment of the present invention.
Figure 2A:
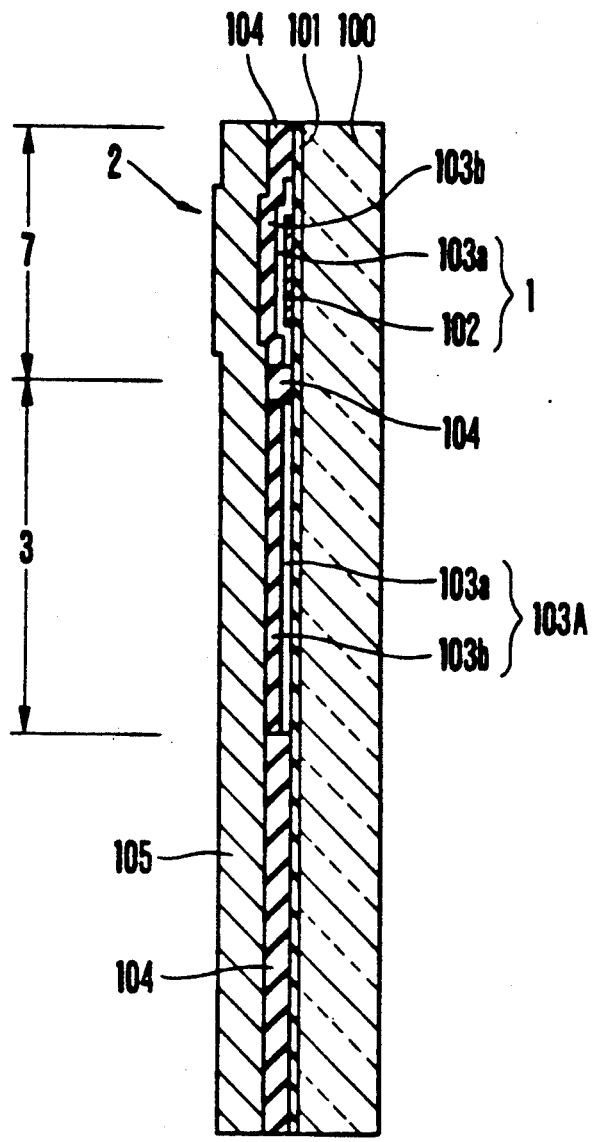
FIG. 2A is a sectional view of the active matrix cell in FIG. 1 along the line IIA—IIA' thereof.
Figure 2B:
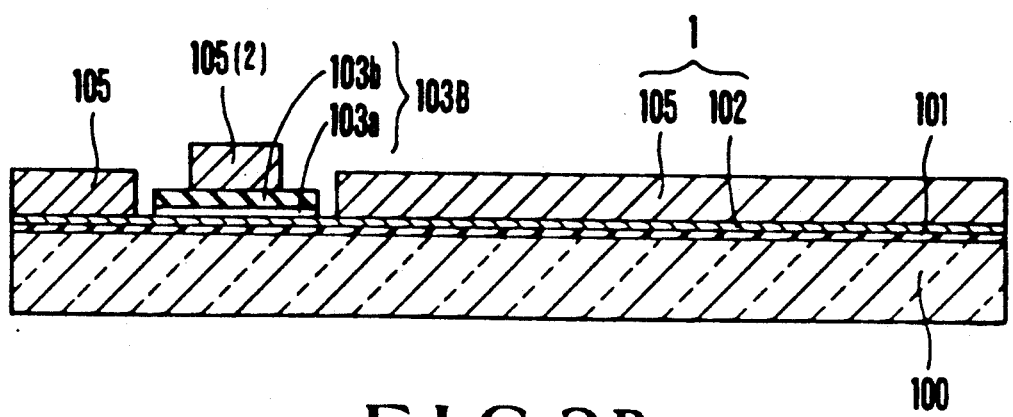
FIG. 2B is a sectional view of the active matrix cell in FIG. 1 along the line IIB—IIB' thereof.
Figure 7:
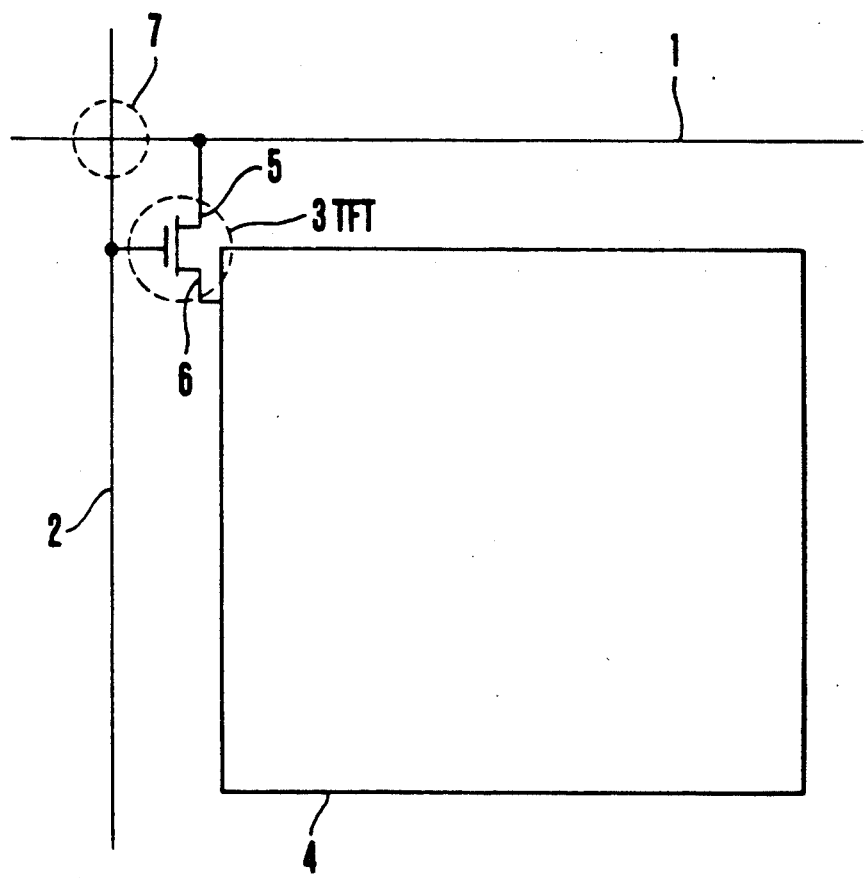
FIG. 7 is a view showing a basic structure of an active matrix cell.
Figure 8A:
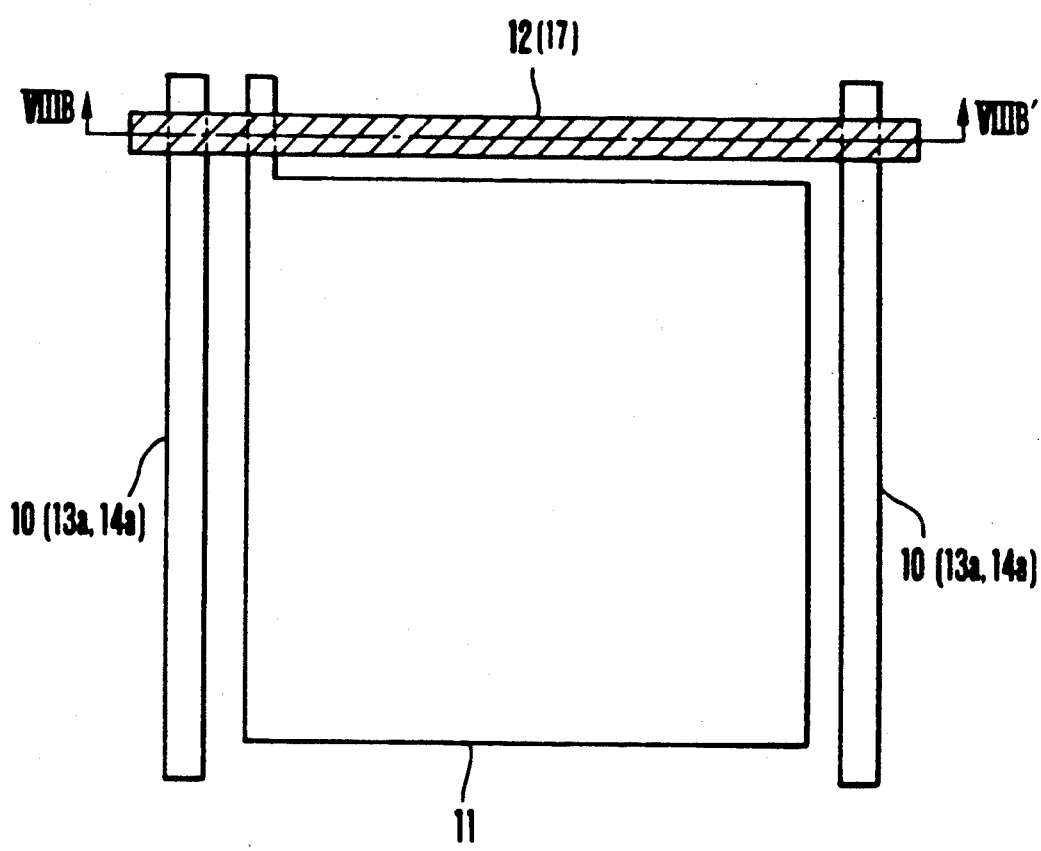
FIGS. 8A and 8B are a plan view and a sectional view showing a conventional active matrix cell.
Figure 8B:
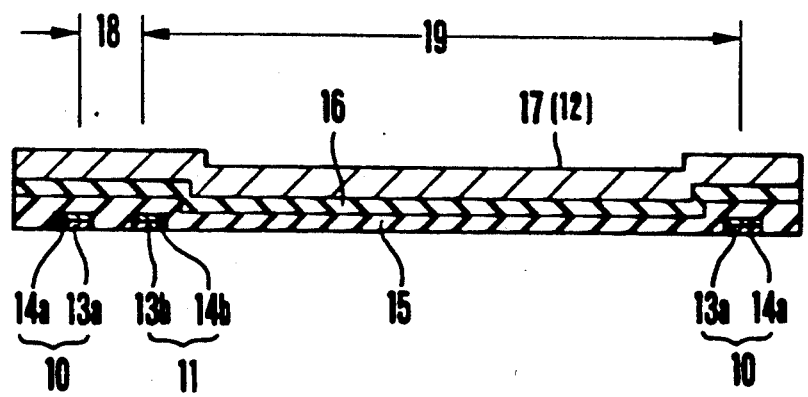
Figure 9A:
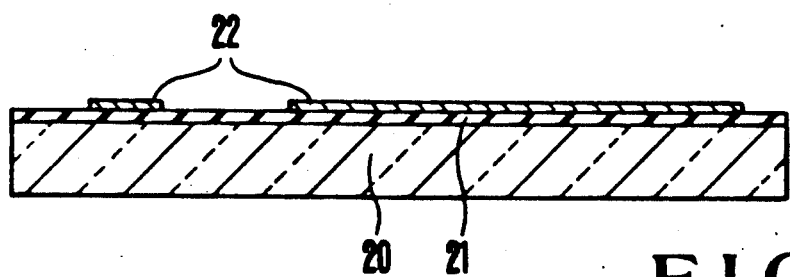
FIGS. 9A to 9E are sectional views showing the steps in manufacturing another conventional active matrix cell.
Figure 9B:
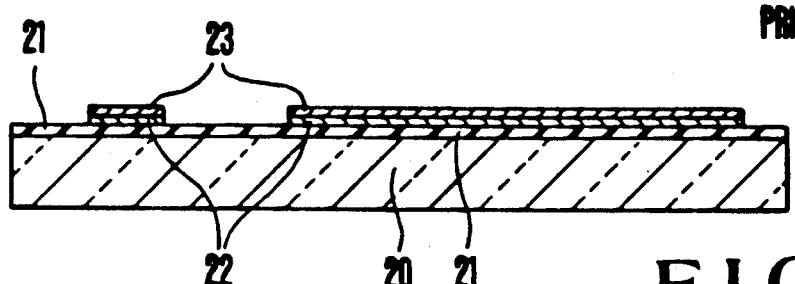
Figure 9C:
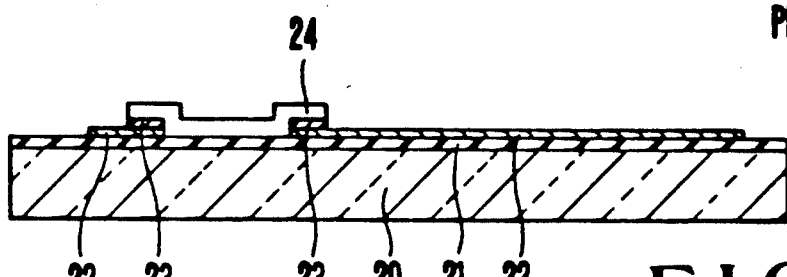
Figure 9D:
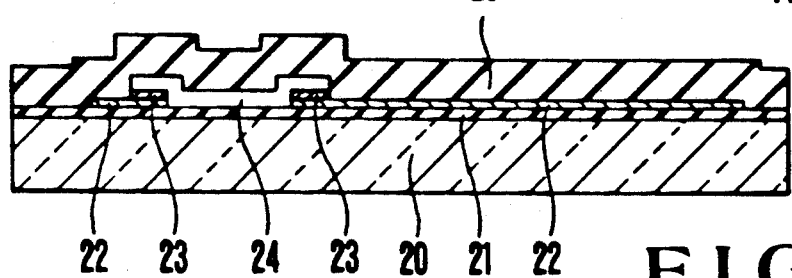
Figure 9E:
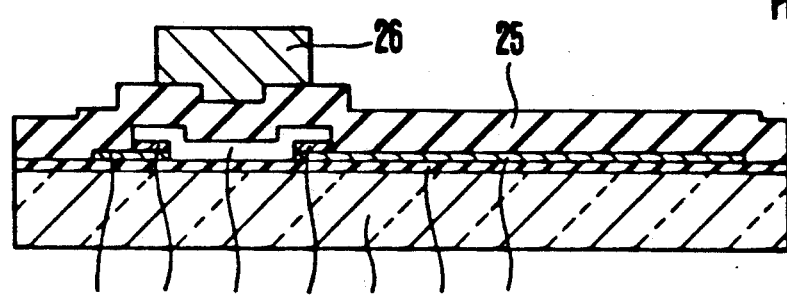

FIGS. 1, 2A, and 2B show an active matrix cell according to an embodiment of the present invention. As in the cell shown in FIG. 7, the active matrix cell of this embodiment includes a data line 1, a scanning line 2, a field effect TFT 3, and a pixel electrode 4. The active matrix cell comprises: a protective film 101 formed on a transparent glass substrate 100 to prevent impurity contamination of a TFT 3; a first conductive film or conductor group 102 consisting of a multilayered film of an ITO film, an Mo film, and an n+a-Si film, which serve a source 5 of the TFT 3, a drain 6 of the TFT 3, part of the data line 1, and the pixel electrode 4; two-layered regions 103A, 103B consisting of an a-Si semiconductor film 103a partially overlapping the first conductor group 102 and an $SiN_x$ first insulating film or insulator 103b formed on the semiconductor 103a so as to have a same area as that of the semiconductor; a second insulating film or insulator 104 which consists of a photosensitive polyimide, contacts the side surface of the two-layered regions 103A, 103B, has substantially the same thickness as that of the two-layered regions, and covers a region excluding the two-layered regions 103A, 103B and the first conductive film 102; and a second conductive film or conductor group 105 formed on the two-layered region 103A, 103B, the second insulating film 104, and the first conductor group 102 serving as the scanning line 2 and part of data line 1. The two-layered region 103A constitutes an active region of the TFT 3 by connecting the source 5 and the drain 6. The two-layered region 103B insulates the intersection region 7 between the data line 1 and the scanning line 2 and has an area larger than an area defined by the widths of adjacent data and scanning lines 1 and 2. One second conductor of the second conductor group 105 partially overlap the source 5 and the drain 6 to have a width larger than the distance between the source 5 and the drain 6 and is formed between the source 5 and the drain 6 to constitute the scanning line 2 including the gate electrode of the TFT 3, as shown in FIG. 1. The other of the second conductor group 105 is in contact with the data line 1 of the first conductive film to decrease the resistance of the data line 1 while being not connected to the scanning line 2.

As shown in FIG. 2A, in the intersection region 7 between the data and scanning lines 1 and 2 and the TFT 3, one second conductor of the second conductor group 105 as the uppermost layer and the semiconductor layer 103a are insulated from each other through the second insulating film 104. The scanning line 2 is formed on a substantially flat surface. As is apparent from FIG. 2B, the data line 1 is constituted by a multilayered film consisting of one first conductor of the first conductor group 102 and parts of the second conductor group 105.

Figure 3A:
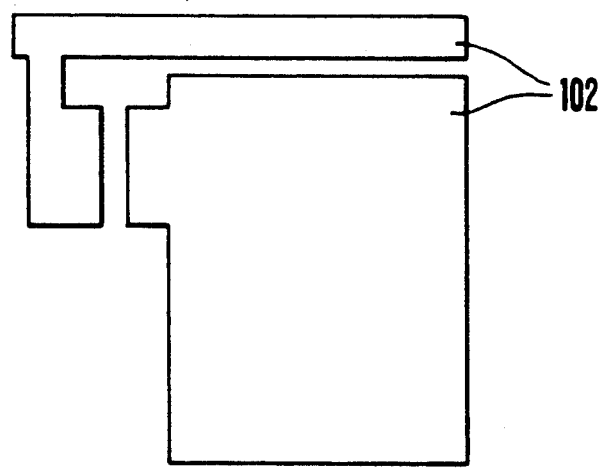
FIGS. 3A to 3C are views showing the layout patterns of the three masks for forming the active matrix cell in FIG. 1.
Figure 3B:
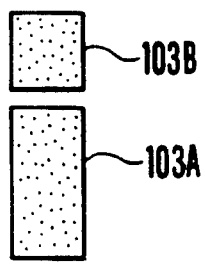
Figure 3C:
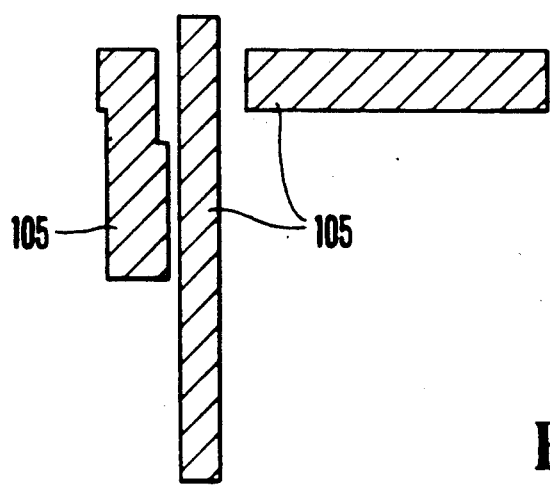

FIGS. 3A, 3B, and 3C show the layout patterns of masks required for forming the active matrix cell structure. The required number of masks is three, and these masks correspond to those in FIG. 1. A mask shown in FIG. 3A is the first mask for forming the first conductor group 102. A mask shown in FIG. 3B is the second mask for forming the two-layered regions 103A, 103B. A mask shown in FIG. 3C is the third mask for forming the second conductor group 105. These masks are represented by the same hatched portions as in FIG. 1.

Figure 4A:
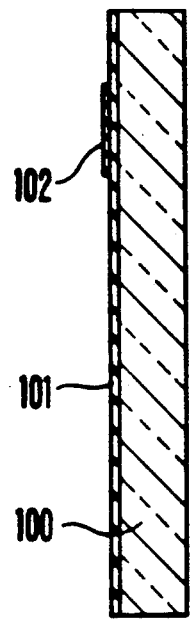
FIGS. 4A to 4E are sectional views showing steps in manufacturing the active matrix cell shown in FIG. 1.
Figure 4A:
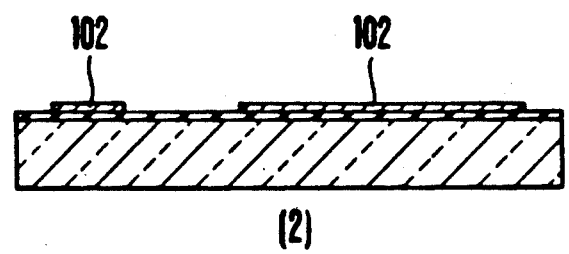

A method of manufacturing the active matrix cell having the structure described above will be described with reference to FIGS. 4A to 4E. The sectional view along the line IIA—IIA' in FIG. 1 is represented by (1); and the sectional view along the line IV—IV' in FIG. 1 is represented by (2). Barium borosilicate glass (Corning 7059) is used as a material for a substrate 100. A 2,000-Å thick $SiN_x$ is deposited by PCVD as a protective layer 101 on the substrate 100 to prevent characteristic degradation caused by impurity contamination from the substrate glass to the TFT. The substrate has a high transparency for an exposure light when exposed from the back side of the substrate. In other words, this exposure light is the exposure wavelength for a negative type photosensitive resin (to be described later). A 500-Å thick ITO transparent conductive film is deposited by sputtering. A 400-Å thick Mo film is then deposited by electron beam evaporation (EB) and serves as a light-shielding mask for exposure from the back side of the substrate. A 200-Å thick phosphorus-doped n+a-Si film is deposited by the PCVD method. A photoresist pattern for the source and drain of the TFT, part of the data line, and the pixel electrode is formed on a multilayered structure consisting of the ITO film, the Mo film, and the n+a-Si film by using the first mask. The photoresist pattern serves as an etching preventive film. The n+a-Si film is patterned by reactive ion etching using $CCl_2F_2$ gas, the Mo film is then etched by reactive ion etching using a gas mixture of $CCl_2F_2$ and $O_2$, and the ITO film is etched by an aqueous solution containing HCl and $NHO_3$, thereby forming the first conductor group 102, as shown in (1) and (2) in FIG. 4A.

Figure 4B:
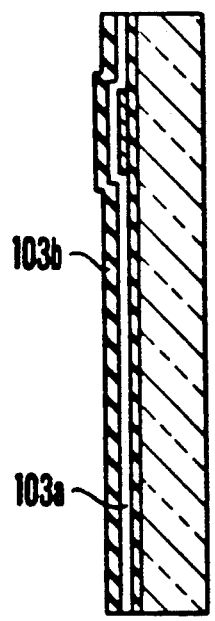
Figure 4B:
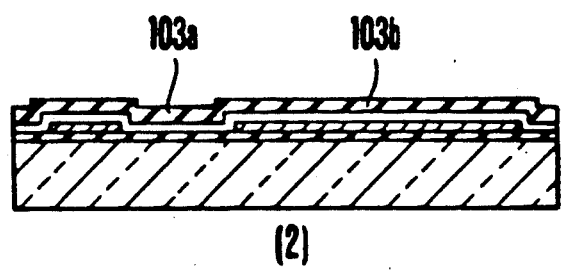
Figure 4C:
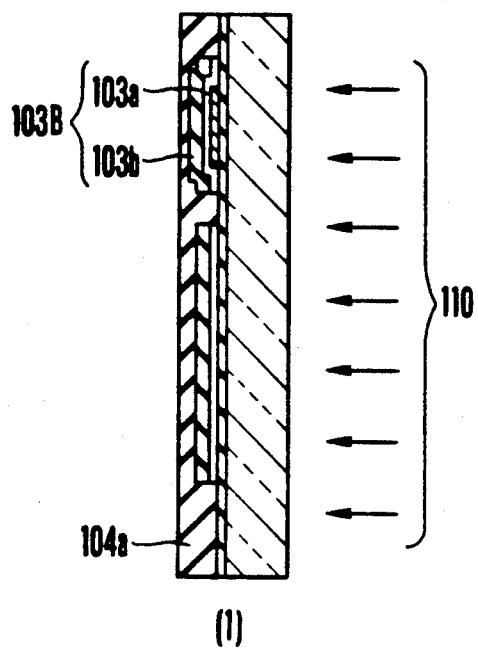
Figure 4C:
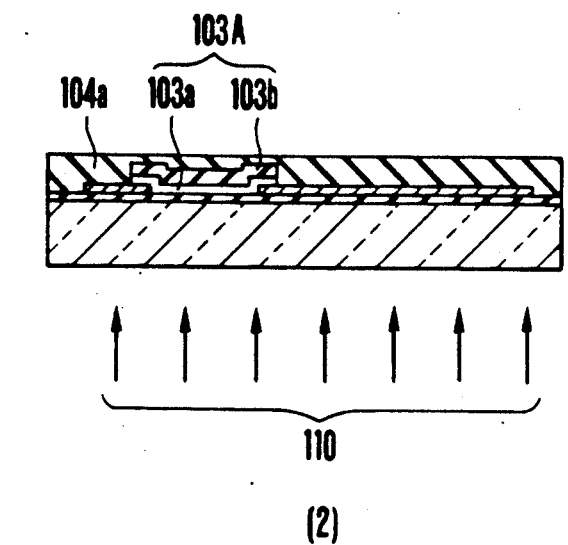
Figure 4D:
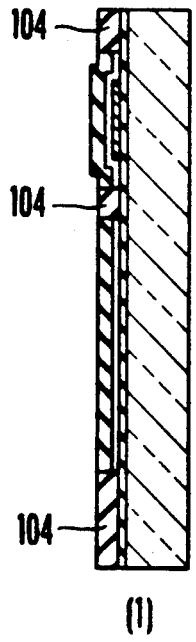
Figure 4D:
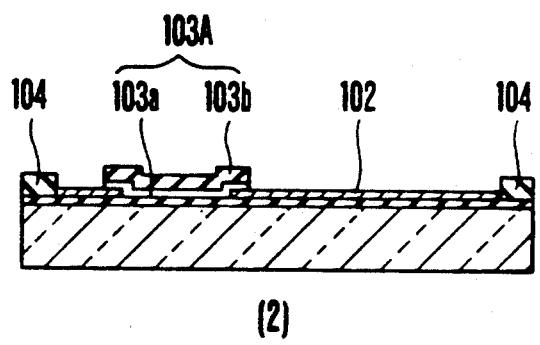

After the photoresist pattern is removed, the 1,200-Å thick a-Si semiconductor film 103a and 200-Å thick $SiN_x$ first insulating film 103b are continuously deposited by the PCVD without breaking vacuum, as shown in FIG. 4B. By using the second mask, a photoresist pattern for the two-layered region 103A, 103B for the TFT and the intersection between lines are formed to etch the $SiN_x$ film by reactive ion etching using $CF_4$ gas, and to etch the a-Si film by reactive ion etching using $CCl_2F_2$ gas. After etching, the two-layered regions 103A, 103B are formed as indicated by (1) and (2) in FIG. 4C. At this time, the n+a-Si film in the first conductor group 102 except for the two-layered regions 103A, 103B are removed. A negative type photosensitive polyimide 104a (e.g., Toray Photoneese UR-3600) is applied to the substrate by spin coating. The polyimide 104a is prebaked at a recommended temperature of 83° C. The polyimide 104a is exposed with an ultraviolet light 110 of 1,000 mJ/cm² from the back side of the substrate. The nonexposed polyimide 104a is removed by a recommended developing solution. The resultant structure is annealed at 250° C. to cause a chemical reaction for imidization, thereby forming the second insulating film 104 which covers the area excluding the two-layered regions 103A, 103B and the first conductor group 102. At this time, the second insulating film 104 is self-aligned with respect to the two-layered regions 103A, 103B, and the first conductor film 102 so as to fill the gap therebetween.

Figure 4E:
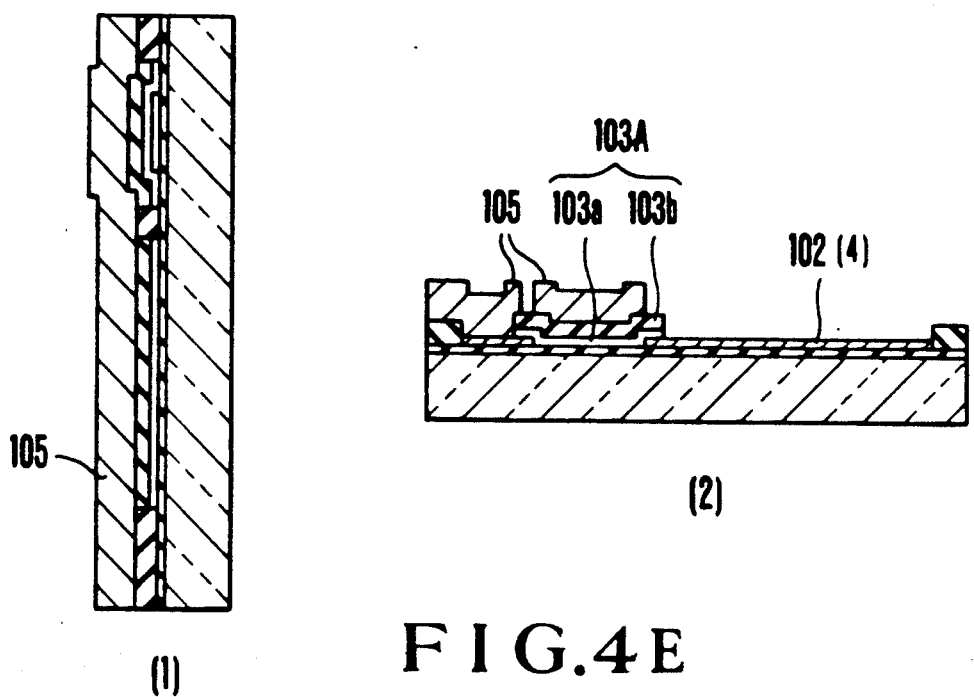

Thereafter, as shown in (1) and (2) of FIG. 4E, a 1-μm thick Al film for a scanning line including the gate electrode is deposited and patterned using the third mask, thereby forming the second conductor group 105. At this time, the Mo film in the first conductor group 102 is removed together with Al. Therefore, the pixel electrode 4 consisting of the first conductor group 102 is made of only the ITO film, thereby completing the active matrix cell.

When the characteristics of the resultant TFT 3 were measured, a field effect mobility μ was 0.5 cm$^2$/Vsec, a leaking current was $10^{-12}$ A, and an ON-OFF ratio was some $10^6$ value. These characteristics were found to be sufficient for the active matrix TFT. Electrical insulation between the scanning line of the second conductor group 105 and the a-Si semiconductor 103b is perfectly maintained at the TFT and the intersection, and no abnormal current leakage from the scanning line 105 to the semiconductor 103b was not found. Since the data line is made of a multilayered film consisting of the first conductor group 102 and the second conductor group 105, the data line resistance can be reduced to about 1/10 that of the conventional data line structure.

According to this embodiment, the semiconductor layer 103a and the first insulating film 103b serving as the gate insulator can be continuously deposited without breaking vacuum, so that stability of an interface between the semiconductor layer 103a and the first insulating film 103b can be improved.

The technique for exposing the photosensitive resin from the back side of the substrate, which is a characteristic feature of the present invention, will be supplementarily described below. Alumina borosilicate glass or the like may be used in place of the barium borosilicate glass (typical example is Corning 7059) for an active matrix display. Such glass materials have a high transparency for ultraviolet light used in exposure of the photosensitive resin. Therefore, exposure can be performed from the back side of the substrate. In this case, an Si-based semiconductor has a low transparency and can serve as a light-shielding mask when the resin is exposed from the back side of the substrate. As the first conductor group includes an opaque conductor, the second insulating film can be easily self-aligned in a region excluding the first conductor group and the two-layered regions. The second insulating film electrically insulates the scanning line of the second conductor group from the two-layered regions, and it must therefore be perfectly formed to cover the side surface of the semiconductor layer. When the resin is exposed from the back side of the substrate while the two-layered regions serve as a light-shielding mask, the peripheral region on the two-layered regions is exposed by light diffraction, and the photosensitive regin is left on the peripheral region of the two-layered regions. Therefore, the side surface of the semiconductor layer can be completely covered with the photosensitive resin, thus assuring high reliability of the method of the present invention.

Since transparency of the substrate and the light-shielding properties of the first conductor group and the two-layered region are associated with the objects of the present invention to some degree that the second insulating film can be formed on the entire surface excluding the first conductor group and the two-layered region and does not require apparently perfect transparency and the light-shielding properties. Transparency and the light-shielding properties can be adjusted in accordance with properties of photosensitive resins, exposure conditions, and developing conditions.

Figure 5:
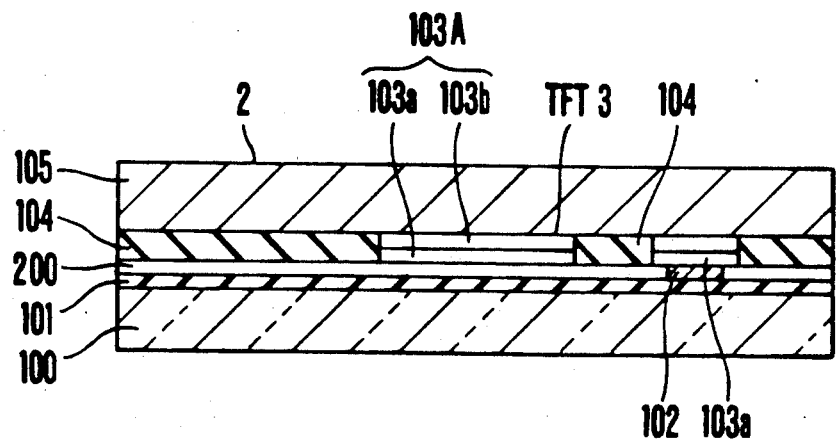
FIG. 5 is a sectional view showing the main part of a modification of the present invention.

As a shape corresponding to FIG. 2A in this embodiment, a third insulating film 200 may be buried around a first conductor group, as shown in FIG. 5, due to the following reasons. Even if the thickness of the Mo film is increased to reduce the resistance of the intersection region 7 and an increase in step height of the source and drain of the TFT occurs, degradation of the TFT characteristics can be prevented. In addition, the scanning line 1 can be made on the more flat surface. Therefore, defects, e.g., disconnections and short circuits, caused by poor step coverage can be prevented.

Figure 6A:
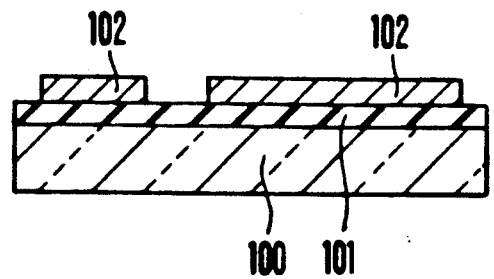
FIGS. 6A to 6E are views showing the modification of the present invention.
Figure 6B:
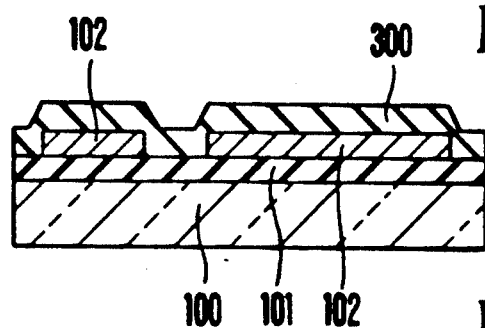
Figure 6C:
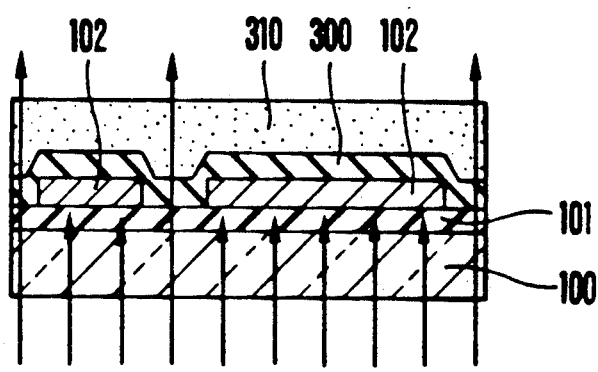
Figure 6D:
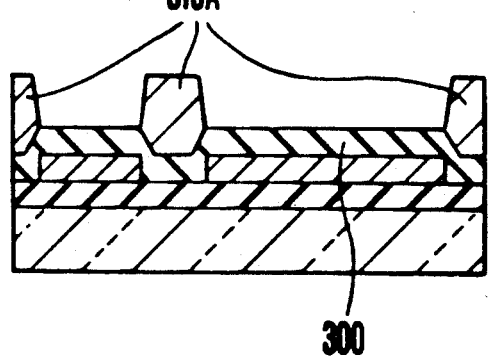
Figure 6E:
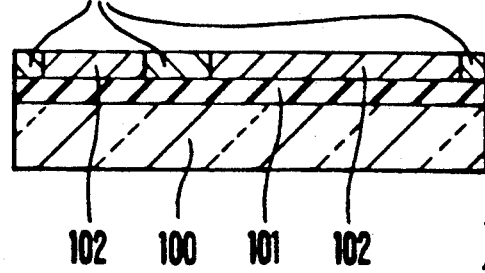

To form the third insulating film 200, the back side exposure technique with a negative type photosensitive resin used for forming the second insulating film can be performed such that the first conductor group is used as a light-shielding mask without modifications. In addition, $SiN_x$ or $SiO_2$ may be used in place of the photosensitive resin. FIGS. 6A to 6E show steps to form the third insulating film when $SiN_x$ is used. As shown in FIG. 6A corresponding to FIG. 4A, after a protective film 101 is formed on a substrate 100, a first conductor group 102 is formed. Subsequently, as shown in FIG. 6B, after an $SiN_x$ film 300 is formed on the first conductor group (FIG. 6B). A negative photoresist 310 is applied (FIG. 6C), and back side exposure is performed with an ultraviolet light. A negative photoresist 310A can be left except for a region on the first conductive film, as shown in FIG. 6D. The $SiN_x$ film is removed by dry etching or the like to obtain the structure shown in FIG. 6E. In this case, the photoresist is removed after etching. After this, steps in FIGS. 4B to 4E are used to complete the active matrix cell without modifications.

In place of the materials used in the above embodiment, poly-Si conventionally used in an active matrix display may be used to form the semiconductor layer 103a. If a p-channel TFT is used, a p-type semiconductor is used in place of an n-type semiconductor. In addition, in the above embodiment, $SiN_x$ is used to form the first insulating film 103b. However, $SiO_2$ or the like may be used if a material has excellent insulating properties and can be used to form a TFT gate insulating film. The second insulating film 104 must be made of a negative photosensitive resin. However, the type of negative photosensitive resin is not limited to any specific one but can be a commercially available negative photoresist, a rubber- or isoprene-based photoresist, or a high-temperature torelant resist. Any material suitable for the gate electrode, such as Mo or poly-Si may be used to form the second conductor group 105.

In the above embodiment, the protective film ($SiN_x$ film or the like) is formed on the substrate to prevent impurity contamination from the substrate, and the active matrix cell is formed on the protective film. However, if there is no fear of impurity contamination from a glass substrate, the protective film may be omitted.

The arrangement shown in FIG. 1 is only an illustrative embodiment of the present invention. Various changes and modifications may be made without departing the spirit and scope of the invention. For example, although the second conductor group 105 on the data line 1 made of the first conductor group 102 is separated from the two-layered region at a position corresponding to the intersection region, the second conductor group 105 may overlap the two-layered region 103 at the intersection region 7 if there is not fear of short-circuiting the second conductor group 105 with the scanning line 2 made of the second conductor group 105. With this structure, the resistance of the data line can be further reduced. In the above embodiment, the two-layered region 103A constituting the TFT active region is perfectly separated from the two-layered region 103B at the intersection region, as shown in FIG.

1. However, if an unnecessary current is not supplied form the data line 1 to the pixel electrode 4 during the OFF state of the TFT 3, they need not be perfectly separated but can be partially connected to each other.

According to the present invention as has been described above, since only three masks are used, the active matrix cell can be advantageously arranged and manufactured with excellent reproducibility at a high product yield.

Furthermore, the data line is made of a two-layered conductor structure, so that the data line resistance can be minimized. Therefore, the display area can be advantageously increased.

Furthermore, the insulating film is not formed on the pixel electrode, and the film structure of the display portion consists of only the alignment layer and the liquid crystal. Therefore, the design of the display portion can be advantageously facilitated.

What is claimed is:

1. A method of manufacturing a field effect thin-film transistor, comprising the steps of:
    depositing a first conductive film on a transparent substrate having a high transparency with respect to a wavelength of exposure light of a negative insulating photosensitive resin, etching said first conductive film in the form of a source and a drain of a field effect thin-film transistor, thereby forming a first conductor group;
    forming a two-layered region consisting of a semiconductor film and a first insulating film, said two-layered region connecting said source and said drain, thereby constituting an active region of said field effect thin-film transistor;
    applying said negative insulating photosensitive resin;
    exposing said photosensitive resin from a back side of said transparent substrate by using said two-layered region and said first conductor group as light-shielding masks, developing said photosensitive resin, and forming a second insulating film of said photosensitive resin so as to contact a side surface of said two-layered region in a region excluding said two-layered region and said first conductor group; and
    depositing a second conductive film and forming a second conductor group including a gate electrode of said field effect thin-film transistor.

2. A method according to claim 1, further comprising the steps of: applying said negative insulating photosensitive resin after the step of forming said first conductive group, exposing said photosensitive resin from said back side of said transparent substrate by using said first conductor group as a light-shielding mask, developing the photosensitive resin, and forming a third insulating film of said photosensitive resin in a region excluding said first conductor group, said third insulating film having substantially the same thickness as that of said first conductor group.

3. A method of manufacturing an active matrix cell, comprising the steps of:
    depositing a first conductive film including an opaque conductive film on a transparent substrate and etching said first conductive film in a form of a source and a drain of a field effect thin-film transistor, part of a data line, and a pixel electrode, thereby forming a first conductor group;
    depositing a semiconductor film and a first insulating film on said semiconductor film, etching said semiconductor film and said insulating film connecting said source and said drain, thereby forming a two-layered region serving as an active region of said thin-film transistor and another two-layered region at an intersection region between said data line and a scanning line having an area larger than an area defined by widths of adjacent ones of said data line and said scanning line;
    applying a negative insulating photosensitive resin;
    exposing said photosensitive resin from a back side of said transparent substrate by using said two-layered regions and said first conductor group as light-shielding masks, developing said photosensitive resin, and forming a second insulating film of said photosensitive resin contacting a side surface of said two-layered region in a region excluding said two-layered region and said first conductor group, said second insulating film having substantially the same thickness as that of said two-layered regions; and
    depositing a second conductive film and etching said second conductive film in a form of said scanning line including a gate electrode of said thin-film transistor as well as in a form of part of said data line on said data line of said first conductor group, thereby forming a second conductor group.

4. A method according to claim 3, further comprising the steps of: applying said negative insulating photosensitive resin after the step of forming said first conductive group, exposing said photosensitive resin from said back side of said transparent substrate by using said first conductor group as a light-shielding mask, developing the photosensitive resin, and forming a third insulating film of said photosensitive resin in a region excluding said first conductor group, said third insulating film having substantially the same thickness as that of said first conductor group.

5. A method according to any one of claims 1 to 4, wherein said second insulating film consists of a negative type photosensitive polyimide.

* * * * *